United States Patent
Sharf

(10) Patent No.: US 11,051,425 B2
(45) Date of Patent: Jun. 29, 2021

(54) THERMAL MANAGEMENT FOR COMMUNICATION SYSTEM

(71) Applicant: TE CONNECTIVITY CORPORATION, Berwyn, PA (US)

(72) Inventor: Alex Michael Sharf, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/118,714

(22) Filed: Aug. 31, 2018

(65) Prior Publication Data

US 2020/0077541 A1    Mar. 5, 2020

(51) Int. Cl.
*H05K 7/20*     (2006.01)
*G02B 6/42*     (2006.01)
(Continued)

(52) U.S. Cl.
CPC ....... *H05K 7/20218* (2013.01); *G02B 6/4268* (2013.01); *H01R 13/005* (2013.01); *H05K 5/0286* (2013.01); *H05K 7/20272* (2013.01)

(58) Field of Classification Search
CPC .......... H05K 7/20218; H05K 7/20254; H05K 7/20272; H05K 7/20327; H05K 7/20436; H05K 7/20636; H05K 7/20645; H05K 7/20772; H05K 7/20781; G06F 1/20; G06F 2200/201; H01R 13/6658; H01R 13/6335; H01R 13/6275; H01R 13/514; H01R 13/6271; H01R 13/6581; H01R 25/006; H01R 25/00; H01R 25/16; H01R 25/162; H01R 2201/04
(Continued)

(56) References Cited

U.S. PATENT DOCUMENTS

| | | | | |
|---|---|---|---|---|
| 4,493,010 A | * | 1/1985 | Morrison | ........... H05K 7/20636 |
| | | | | 165/104.33 |
| 7,134,906 B2 | | 11/2006 | Lawton et al. | |

(Continued)

FOREIGN PATENT DOCUMENTS

JP      H09298378     * 11/1997

OTHER PUBLICATIONS

Kajiura, JPH09298378, System for Cooling Electronic modules, Nov. 18, 1997 (Year: 1997).*

*Primary Examiner* — Zachary Pape
*Assistant Examiner* — Amir A Jalali

(57) ABSTRACT

A communication system includes a receptacle assembly and a pluggable module. The receptacle assembly has a receptacle housing includes walls forming a module cavity with a communication connector at a back end thereof. The receptacle assembly has a liquid cooling assembly having a liquid cooling channel coupled to the receptacle housing and a fitting in flow communication with the liquid cooling channel. The pluggable module is receivable in the module cavity and has a pluggable body holding a module circuit board and a liquid cooling assembly coupled to the pluggable body. The liquid cooling assembly includes a liquid cooling channel in thermal communication with the pluggable body and a module fitting mated with the fitting of the receptacle assembly to couple the liquid cooling channel of the pluggable module in flow communication with the liquid cooling channel of the receptacle assembly.

25 Claims, 4 Drawing Sheets

(51) Int. Cl.
*H01R 13/00* (2006.01)
*H05K 5/02* (2006.01)

(58) Field of Classification Search
USPC .......... 361/699, 679.53, 702; 165/80.4–80.5,
165/104.33; 257/714; 439/607.4, 607.23,
439/67.28, 607.35, 607.21
See application file for complete search history.

(56) References Cited

U.S. PATENT DOCUMENTS

| | | | | |
|---|---|---|---|---|
| 9,620,906 | B1* | 4/2017 | Briant | H01R 13/6581 |
| 9,761,974 | B2 | 9/2017 | L'Esperance et al. | |
| 10,104,760 | B1* | 10/2018 | Briant | G02B 6/4268 |
| 2005/0068728 | A1* | 3/2005 | Chu | G06F 1/20 |
| | | | | 361/690 |
| 2006/0002080 | A1* | 1/2006 | Leija | H05K 7/20772 |
| | | | | 361/679.46 |
| 2006/0065874 | A1* | 3/2006 | Campbell | H05K 7/20772 |
| | | | | 251/348 |
| 2007/0064397 | A1* | 3/2007 | Chiba | G06F 1/1632 |
| | | | | 361/702 |
| 2009/0149077 | A1* | 6/2009 | Trimborn | H01R 13/005 |
| | | | | 439/660 |
| 2010/0259886 | A1* | 10/2010 | Mongia | G06F 1/1632 |
| | | | | 361/679.47 |
| 2011/0313576 | A1* | 12/2011 | Nicewonger | F28D 15/00 |
| | | | | 700/282 |
| 2012/0069519 | A1* | 3/2012 | Caron | H05K 7/20636 |
| | | | | 361/691 |
| 2015/0077937 | A1* | 3/2015 | Daly | H04B 10/40 |
| | | | | 361/700 |
| 2017/0030497 | A1* | 2/2017 | Bai | H05K 7/20272 |
| 2017/0181321 | A1* | 6/2017 | Shelnutt | H05K 7/20763 |
| 2017/0245397 | A1* | 8/2017 | Hirano | H05K 7/20772 |
| 2019/0171258 | A1* | 6/2019 | Rice | B60R 16/0231 |

* cited by examiner

THERMAL MANAGEMENT FOR COMMUNICATION SYSTEM

BACKGROUND OF THE INVENTION

The subject matter described herein relates to thermal management for a receptacle assembly and/or pluggable module of a communication system.

At least some known communication systems include receptacle assemblies, such as input/output (I/O) connector assemblies, that are configured to receive a pluggable module and establish a communicative connection between the pluggable module and an electrical connector of the receptacle assembly. As one example, a known receptacle assembly includes a receptacle housing that is mounted to a circuit board and configured to receive a small form-factor (SFP) pluggable transceiver. The receptacle assembly includes an elongated cavity that extends between an opening of the cavity and an electrical connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection.

A challenge often encountered in the design of the pluggable module and receptacle assembly is the heat generated during operation of the communication system, which negatively affects module/system reliability and electrical performance. Typically, heat is generated by components on the module circuit board within the pluggable module and drawn away from the module circuit board by the metal body of the pluggable module. In some cases, a heat sink is used to dissipate heat from the pluggable module. However, as speeds increase, conventional heat sinks are proving inadequate for thermal loads generated by pluggable modules.

Accordingly, there is a need to provide cost-effective thermal management for communication systems.

BRIEF DESCRIPTION OF THE INVENTION

In an embodiment, a communication system is provided including a receptacle assembly configured to receive a pluggable module having a liquid cooling channel. The receptacle assembly includes a receptacle housing further including walls forming a module cavity configured to receive the pluggable module. The receptacle housing has a port at a front end of the module cavity configured to receive the pluggable module. The receptacle assembly includes a communication connector is positioned relative to the module cavity to interface with the pluggable module to create an electrical connection with the pluggable module. The receptacle assembly includes a liquid cooling assembly having a liquid cooling channel coupled to the receptacle housing, the liquid cooling channel providing liquid cooling supply for the pluggable module. The liquid cooling assembly has a fitting in flow communication with the liquid cooling channel and configured to be in fluid communication with the liquid cooling channel of the pluggable module.

In another embodiment, a communication system is provided including a receptacle assembly and a pluggable module. The receptacle assembly has a receptacle housing includes walls forming a module cavity and having a port at a front end of the module cavity and a communication connector at a back end of the module cavity. The receptacle assembly has a liquid cooling assembly having a liquid cooling channel coupled to the receptacle housing and a fitting in flow communication with the liquid cooling channel. The pluggable module is receivable in the module cavity and has a pluggable body extending between a mating end and a rear end. The pluggable module has a module circuit board held by the pluggable body configured to be electrically connected to the communication connector. The pluggable module has a liquid cooling assembly coupled to the pluggable body. The liquid cooling assembly includes a liquid cooling channel in thermal communication with the pluggable body and a module fitting mated with the fitting of the receptacle assembly to couple the liquid cooling channel of the pluggable module in flow communication with the liquid cooling channel of the receptacle assembly.

In a further embodiment, a communication system is provided for a receptacle assembly having a receptacle housing including a communication connector positioned at a back end of a module cavity and having a liquid cooling assembly with a liquid cooling channel and a fitting in flow communication with the liquid cooling channel. The communication system includes a pluggable module configured to be received in the pluggable module and mated with the communication connector and the liquid cooling assembly. The pluggable module includes a pluggable body extending between a mating end and a rear end. The pluggable body has an upper shell including an upper wall and a lower shell including a lower wall. The pluggable module includes a module circuit board held by the pluggable body between the upper shell and the lower shell. The module circuit board includes an upper surface and a lower surface. The module circuit board arranged at the mating end of the pluggable body and configured to be electrically connected to the communication connector. The module circuit board has an electronic component electrically connected to the module circuit board generating heat. The pluggable module includes a liquid cooling assembly coupled to the pluggable body. The liquid cooling assembly has a liquid cooling channel in thermal communication with the pluggable body. The liquid cooling assembly has a module fitting at the mating end configured to be mated with the fitting of the receptacle assembly to couple the liquid cooling channel of the pluggable module in flow communication with the liquid cooling channel of the receptacle assembly.

DETAILED DESCRIPTION OF THE INVENTION

Embodiments set forth herein include communication systems having thermal management for dissipating heat from pluggable modules. Various embodiments described herein provide liquid cooling for pluggable modules. Embodiments described herein provide liquid cooling assemblies associated with receptacle assemblies that interface with liquid cooling assemblies associated with pluggable modules for dissipating heat from the pluggable modules. For example, in an exemplary embodiment, cooling flow is able to be circulated through the pluggable modules when they are plugged into the receptacle assemblies.

Figure 1:
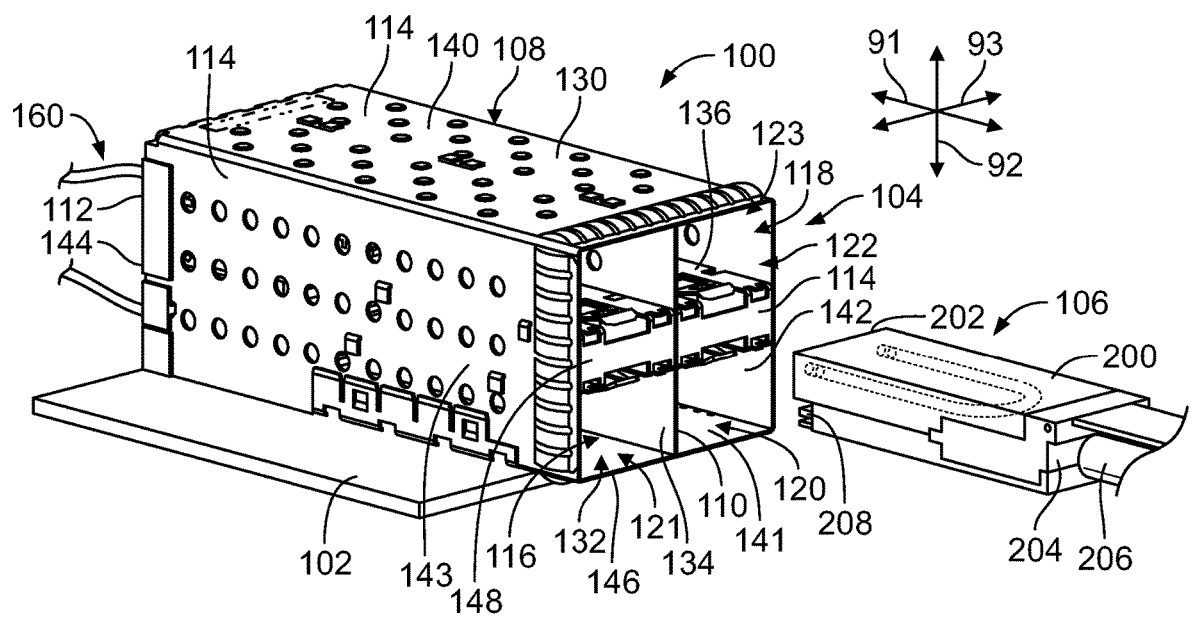
FIG. 1 is a front perspective view of a communication system in accordance with an embodiment.

FIG. 1 is a front perspective view of a communication system 100 in accordance with an embodiment. The communication system 100 includes a circuit board 102, a receptacle assembly 104 mounted to the circuit board 102, and one or more pluggable modules 106 that are configured to communicatively engage the receptacle assembly 104. The receptacle assembly 104 is illustrated as a stacked and ganged receptacle assembly 104 configured to receive multiple pluggable modules 106 in stacked and ganged arrangements. While only one pluggable module 106 is shown in FIG. 1, it is understood that multiple pluggable modules 106 may simultaneously engage the receptacle assembly 104.

The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. For example, the circuit board 102 may be oriented vertically, horizontally, or in another orientation.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The receptacle assembly 104 includes a receptacle housing 108 that is mounted to the circuit board 102. The receptacle housing 108 may also be referred to as a receptacle cage. The receptacle housing 108 may be arranged at a bezel or faceplate (not shown) of a chassis of the system or device, such as through an opening in the faceplate. As such, the receptacle housing 108 is interior of the device and corresponding faceplate and the pluggable module(s) 106 is loaded into the receptacle housing 108 from outside or exterior of the device and corresponding faceplate. In the illustrated embodiment, the receptacle assembly 104 is provided with liquid cooling assemblies 160 for dissipating heat from the pluggable modules 106.

The receptacle housing 108 includes a front end 110 and an opposite back end 112. The front end 110 may be provided at, and extend through an opening in, the faceplate. The mating axis 91 may extend between the front and back ends 110, 112. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104. In other examples, the top and bottom may be referenced to the circuit board 102 with the bottom positioned closer to the circuit board and the top positioned further from the circuit board. The top may be positioned below the bottom in some orientations and the top and bottom may be vertically aligned in some orientations, such as when the circuit board 102 is oriented vertically as opposed to horizontally.

The receptacle housing 108 is configured to guide the pluggable module(s) 106 during a mating operation. To this end, the receptacle housing 108 includes a plurality of housing walls 114 that are interconnected with one another to form the receptacle housing 108. In an exemplary embodiment, the housing walls 114 are configured to contain or block electromagnetic interference (EMI). To this end, the housing walls 114 may be formed from a conductive material, such as sheet metal and/or a polymer having conductive particles. For example, in the illustrated embodiment, the housing walls 114 are stamped and formed from sheet metal. In alternative embodiments, rather than being solid, conductive walls for electrical shielding, the housing walls 114 may be open-sided, frame-like walls used generally for guiding the pluggable modules 106 into the receptacle housing 108 rather than for electrical shielding.

In some embodiments, the receptacle housing 108 is configured to facilitate airflow through the receptacle housing 108 to transfer heat (or thermal energy) away from the receptacle assembly 104 and pluggable module(s) 106. For example, airflow openings may be provided in the housing walls 114 to allow airflow through the receptacle housing 108. The air may flow from inside the receptacle housing 108 to the external environment or from outside the receptacle housing 108 into the interior of the receptacle housing 108. Fans or other air moving devices may be used to increase airflow through the receptacle housing 108 and over the pluggable module(s) 106.

In the illustrated embodiment, the receptacle housing 108 includes a first (or bottom) row 116 of elongated module cavities 120 and a second (or top) row 118 of elongated module cavities 122. Each of the module cavities 120, 122 extends between the front and back ends 110, 112. The module cavities 120, 122 have respective port openings 121, 123 that are sized and shaped to receive a corresponding pluggable module 106. The module cavities 120, 122 may have the same or similar dimensions and extend lengthwise in a direction that is parallel to the mating axis 91. In the illustrated embodiment, each module cavity 122 is stacked over a corresponding module cavity 120 such that the module cavity 120 is positioned between the module cavity 122 and the circuit board 102; however the module cavities 122 may be provided in a single row without the module cavities 120 below in alternative embodiments. The module cavities 120, 122 are ganged together in any number of columns, including a single column. Any number of module cavities may be provided including a single module cavity.

In some embodiments, the receptacle housing 108 is formed from a plurality of interconnected panels or sheets. For example, the receptacle housing 108 includes a main panel or shell 130 that surrounds a housing cavity 132, one or more interior panels 134, a base panel 141, and one or more separator panels 136 defining a port separator 148. Each of the main panel 130, the interior panels 134, and the separator panels 136 may be stamped and formed from sheet metal. As described in greater detail below, each of the main panel 130, the interior panels 134, and the separator panels 136 may form one or more of the housing walls 114 that define the module cavity 120, the module cavity 122, and the port separator 148. The interior panels 134 and the separator panels 136 are disposed within the housing cavity 132. Within the main panel 130, the interior panels 134 and the separator panels 136 apportion or divide the housing cavity 132 into the separate module cavities 120, 122.

The main panel 130 includes a top wall 140, sidewalls 142, 143, and a back wall 144. The top wall 140 defines the top of the upper module cavity 122. The separator panel 136 may define a bottom or bottom wall of the module cavity 122. The separator panel 136 may define a top wall of the lower module cavity 120. The base panel 141 may rest near the circuit board 102, and may thus define a bottom 146 of the receptacle assembly 104. In alternative embodiments, the circuit board 102 may define the bottom as opposed to using the base panel 141. The sidewalls 142, 143 and the back wall 144 are configured to extend from the circuit board 102, when mounted thereto, to the top wall 140. As noted above, rather than panels, the housing walls 114 may be defined by frames or beams that are open-sided and used for guidance of the pluggable modules.

The main panel 130, the base panel 141, the interior panels 134, and the separator panels 136 may comprise conductive material, such as metal or plastic. When the receptacle housing 108 is mounted to the circuit board 102, the receptacle housing 108 and the receptacle assembly 104 are electrically coupled to the circuit board 102 and, in particular, to ground planes (not shown) within the circuit board 102 to electrically ground the receptacle housing 108 and the receptacle assembly 104. As such, the receptacle assembly 104 may reduce EMI leakage that may negatively affect electrical performance of the communication system 100.

In various embodiments, the housing walls 114 of the receptacle housing 108 may optionally form a port separator 148 between the module cavities 120, 122. In the illustrated embodiment, the port separator 148 is a single wall or plate separating the module cavities 120, 122. The port separator 148 extends generally parallel to the mating axis 91 between the front end 110 and the back end 112. More specifically, the module cavity 120, the port separator 148, and the module cavity 122 are stacked along the elevation axis 92. In alternative embodiments, the port separator 148 may have two separating walls 147 (shown in FIG. 3) separated by a gap 149 between the upper and lower module cavities 120, 122. Optionally, a light-indicator assembly (not shown), such as a light pipe may be provided in the gap 149 defined by the port separator 148. The gap 149 may allow airflow between the module cavities 120, 122 to enhance heat transfer of the pluggable modules 106 located in the module cavities 120, 122. The gap 149 may hold components of one or more of the liquid cooling assemblies 160 in various embodiments.

The pluggable module 106 is an input/output (I/O) module configured to be inserted into and removed from the receptacle assembly 104. In some embodiments, the pluggable module 106 is a small form-factor pluggable (SFP) transceiver or quad small form-factor pluggable (QSFP) transceiver. For example, in various embodiments, the pluggable module 106 may be an input/output cable assembly. The pluggable module 106 has a pluggable body 200 including a mating end 202 and an opposite rear end 204. The rear end 204 may be a cable end having a cable 206 extending from the pluggable body 200 at the rear end 204. The pluggable body 200 also includes a module circuit board 208 (FIG. 2) that is communicatively coupled to electrical wires or optical fibers (not shown) of the cable 206. The module circuit board 208 includes contact pads 210 (FIG. 2) at the mating end 202. The mating end 202 is configured to be inserted into the module cavity 122 of the receptacle housing 108 and advanced in a mating direction along the mating axis 91. In an exemplary embodiment, the pluggable body 200 provides heat transfer for the module circuit board 208, such as for the electronic components on the module circuit board 208. For example, the module circuit board 208 and the associated electronic components are in thermal communication with the pluggable body 200 and the pluggable body 200 transfers heat from the module circuit board 208 and the associated electronic components.

Figure 2:
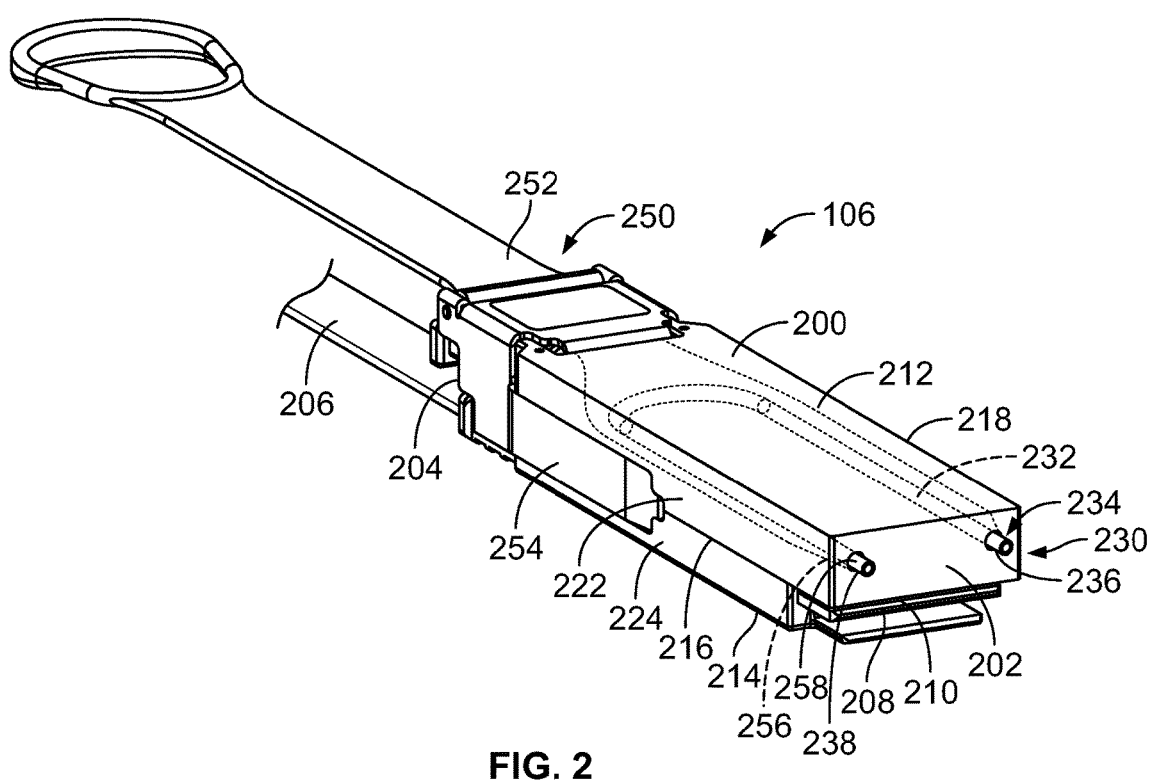
FIG. 2 is a front perspective view of the pluggable module in accordance with an exemplary embodiment.

FIG. 2 is a front perspective view of the pluggable module 106 in accordance with an exemplary embodiment. The pluggable module 106 includes the pluggable body 200 extending between the mating end 202 and the rear end 204. The pluggable body 200 holds the module circuit board 208. The pluggable body 200 has a first end or top end 212 and an opposite second end or bottom end 214 with sides 216, 218 extending between the first and second ends 212, 214. The first and second ends 212, 214 and the sides 216, 218 extend lengthwise along a length of the pluggable body 200 between the mating end 202 and rear end 204. The first end 212, second end 214 and sides 216, 218 define a cavity that holds the module circuit board 208. The cable 206 may extend into the cavity for connection with the module circuit board 208. Optionally, the module circuit board 208 may be exposed at the mating end 202 for mating with a corresponding communication connector 150 (shown in FIG. 3).

In an exemplary embodiment, the pluggable body 200 includes a first shell 222 and a second shell 224. Optionally, the first shell 222 may define an upper shell and may be referred to hereinafter as upper shell 222. The second shell 224 may define a lower shell and be referred to hereinafter as lower shell 224. The upper shell 222 and/or the lower shell 224 are fabricated from a material having a high thermal conductivity. In an exemplary embodiment, the upper shell 222 and/or the lower shell 224 are used for heat transfer from the module circuit board 208. For example, the upper shell 222 and/or the lower shell 224 are placed in thermal communication with the module circuit board 208. Heat generated by electronic components on the module circuit board 208 is drawn into the upper shell 222 and/or the lower shell 224.

The pluggable module 106 includes a liquid cooling assembly 230 for cooling the pluggable module 106 with liquid coolant circulated through the pluggable module 106. The liquid cooling assembly 230 forms a portion of a radiator for dissipating heat from the pluggable module 106. The liquid cooling assembly 230 has a separable interface for interfacing with the liquid cooling assembly 160 of the receptacle assembly 104 (shown in FIG. 3). The liquid cooling assembly 230 allows for direct cooling of the pluggable module 106 with the liquid coolant. In an exemplary embodiment, the liquid cooling assembly 230 includes one or more liquid cooling channels 232 and one or more module fittings 234 for interfacing with the pluggable module 106. For example, in an exemplary embodiment, the liquid cooling assembly 230 includes an inlet module fitting 236 and an outlet module fitting 238. While the pluggable module 106 is illustrated with a single inlet module fitting 236 and a single outlet module fitting 238, the pluggable module 106 may include multiple inlet module fittings 236 and multiple outlet module fittings 238 in alternative embodiments.

The liquid cooling channel 232 may be defined by a pipe(s), such as a flexible pipe, a rigid pipe, a hose, a manifold, and the like routed in or on the pluggable body 200. For example, the pipe may be interior of the pluggable body and/or may be exterior of the pluggable body 200. In other various embodiments, the liquid cooling channel 232 may be defined by a channel formed in the pluggable body 200. For example, a channel may be bored in the pluggable body 200, molded in the pluggable body 200, or otherwise formed in the pluggable body 200. The liquid cooling channel 232 extends from the mating end 202 along a path through the pluggable body 200 allowing the liquid coolant to dissipate heat from the pluggable body 200. The liquid cooling channel 232 may have any appropriately shaped path. Optionally, the liquid cooling channel 232 may have at least one switch-back or curved section to increase the surface area of the pluggable body 200 engaged by the liquid cooling channel 232. For example, in various embodiments, the liquid cooling channel 232 may have a serpentine path. The liquid cooling channel 232 may be routed in close proximity to the heat generating electronic components of the module circuit board 208. The liquid cooling channel 232 size and/or shape may vary in different areas and/or along different segments thereof.

In various embodiments, the liquid cooling channel 232 may be contained internal of the pluggable body 200. In alternative embodiments, the liquid cooling channel 232 may be routed, at least partially, along the exterior of the pluggable body 200. In an exemplary embodiment, the liquid cooling channel 232 may be contained within the upper shell 222. Alternatively, the liquid cooling channel 232 may be contained within the lower shell 224. In other alternative embodiments, the liquid cooling channel 232 may be routed within the upper shell 222 and the lower shell 224. Optionally, the liquid cooling channel 232 may be contained within a single plane within the pluggable body 200, such as a plane located above the module circuit board 208 or a plane located below the module circuit board 208. Alternatively, the liquid cooling channel 232 may traverse both horizontally and vertically within the pluggable body 200.

The module fittings 234 are coupled to the liquid cooling channel 232 and are in flow communication with the liquid cooling channel 232. Optionally, the module fittings 234 may be coupled to the liquid cooling channel 232 by a flexible connection to allow the module fittings 234 to float relative to the mating end 202 to align with the liquid cooling assembly 160. The module fittings 234 have separable mating interfaces for mating with the liquid cooling assembly 160. The module fittings 234 are configured to be sealed to the liquid cooling assembly 160. Optionally, the module fittings 234 may include locking mechanisms configured to be locked when mated with the liquid cooling assembly 160. For example, the module fittings 234 may be fluid couplings. The module fittings 234 may be quick-connect fluid couplings. The module fittings 234 may be non-spill fluid couplings. Optionally, the module fittings 234 may have shut-off valves to shut off fluid flow when disconnected from the liquid cooling assembly 160. In various embodiments, the module fittings 234 may be male fittings extending beyond the mating end of the pluggable body for receipt in female fittings of the receptacle assembly 104. In other various embodiments, the module fittings 234 may be female fittings defining a socket that receives a male fitting of the receptacle assembly 104. The module fittings 234 may be coupled to the pluggable body 200 at the mating end 202 and extend forward of the mating end 202 for mating with the liquid cooling assembly 160 as the pluggable module 106 is loaded into the receptacle assembly 104.

In an exemplary embodiment, the pluggable module 106 includes an actuator assembly 250 having an actuator 252 at the rear end 204 of the pluggable module 106. In the illustrated embodiment, the actuator 252 includes a pull tab accessible at the rear end 204 of the pluggable module 106. The actuator assembly 250 includes a latch 254 configured to latchably secure the pluggable module 106 in the receptacle housing 108. The latch 254 is releasable when the actuator 252 is actuated. The actuator assembly 250 includes a fitting release 256 operably coupled to the module fittings 234. The fitting release 256 releases the module fittings 234 to unlock the module fittings 234 from the liquid cooling assembly 160. The fitting release 256 may pull rearward on the module fittings 234 to release the module fittings 234. For example, module fittings 234 may include sleeves 258 that are pulled rearward by the fitting release 256. The sleeves 258 may form a locking mechanism for the module fittings 234. When released, the module fittings 234 are unlocked. The fitting release 256 may interact with the module fittings 234 in other ways in alternative embodiments when other types of locking mechanisms are provided on the module fittings 234.

Figure 3:
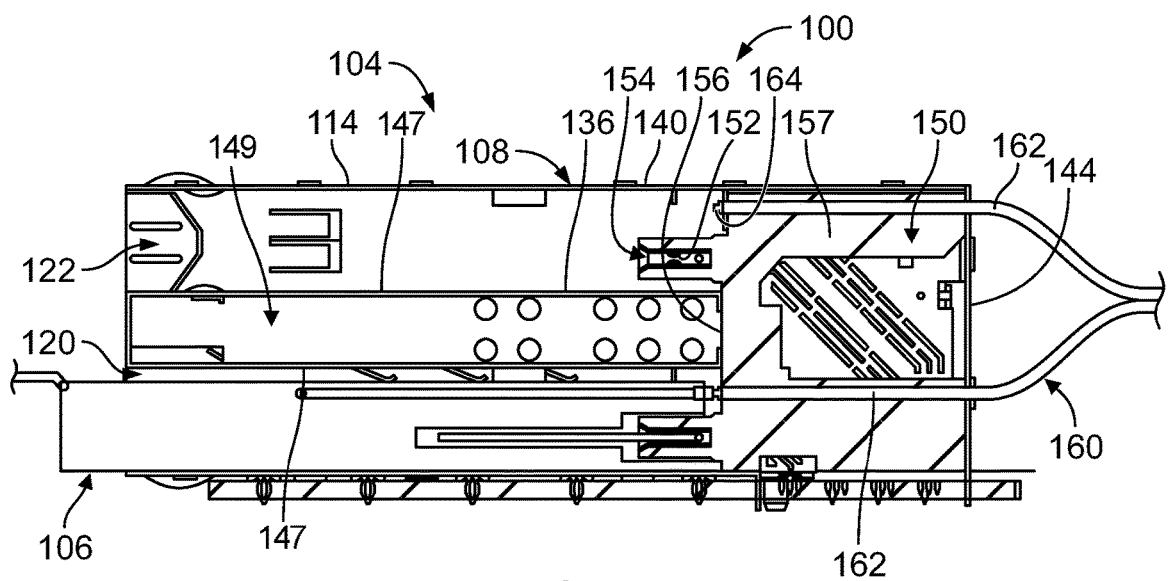
FIG. 3 is a side perspective, cross-sectional view of the communication system in accordance with an exemplary embodiment.
Figure 4:
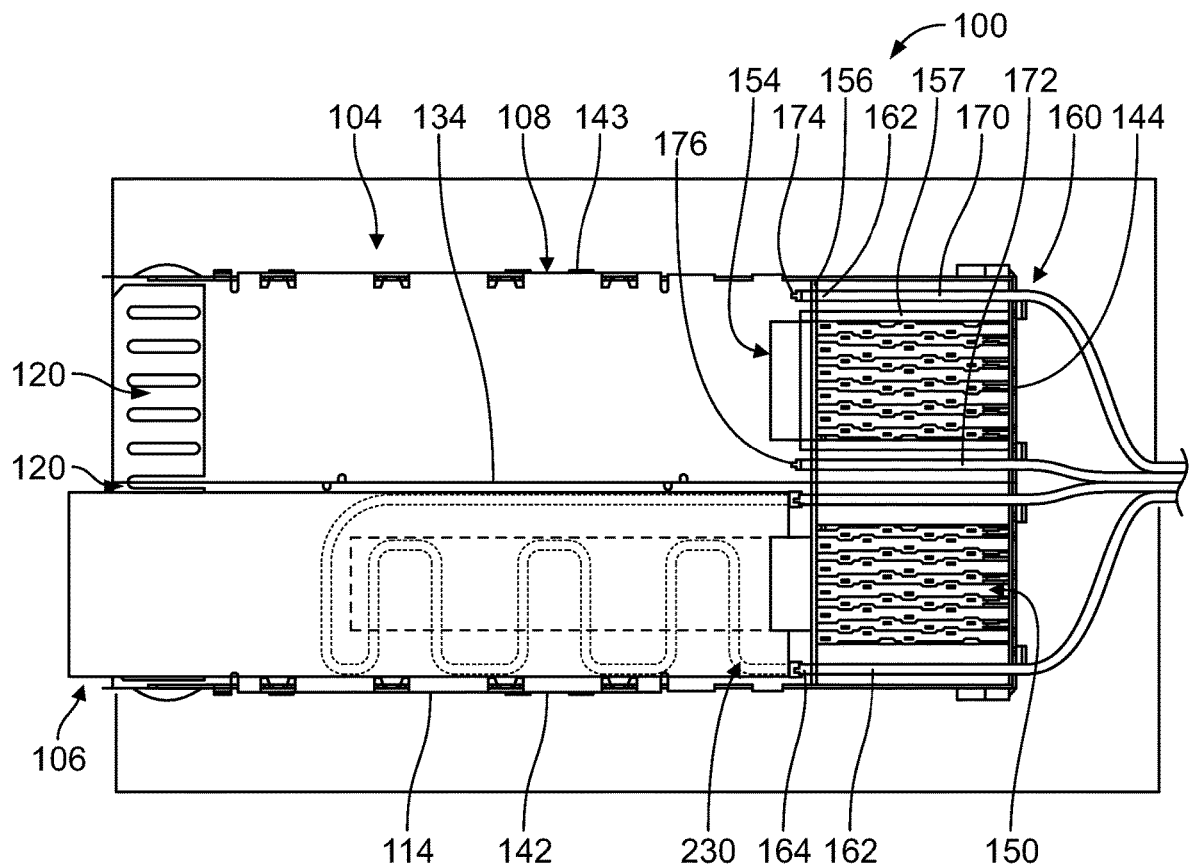
FIG. 4 is a top, cross-sectional view of the communication system in accordance with an exemplary embodiment.

FIG. 3 is a side perspective, cross-sectional view of the communication system 100 in accordance with an exemplary embodiment. FIG. 4 is a top, cross-sectional view of the communication system 100 in accordance with an exemplary embodiment. FIGS. 3 and 4 show the receptacle housing 108 with one of the pluggable modules 106 received therein.

The receptacle assembly 104 includes one or more communication connectors 150 (FIG. 2) having electrical contacts 152 configured for mating with corresponding pluggable modules 106. Each communication connector 150 has one or more mating interfaces 154 at a front 156 of the communication connector 150. In the illustrated embodiment, the communication connector 150 is a stacked communication connector having stacked mating interfaces 154 for the stacked module cavities 120, 122. The lower mating interface 154 is disposed within the module cavity 120, and the upper mating interface 154 is disposed within the module cavity 122. Each mating interfaces 154 has corresponding electrical contacts 152 that are configured to directly engage contact pads of the pluggable module 106. Thus, a single communication connector 150 may mate with two pluggable modules 106. In alternative embodiments, the upper and lower mating interfaces 154 may be part of different communication connectors 150. For example, the receptacle assembly 104 may include a lower communication connector located below an upper communication connector to define the lower and upper mating interfaces 154. In other alternative embodiments, the receptacle assembly 104 does not include the stacked module cavities 120, 122 and, instead, includes only a single row of module cavities 120 or only a single module cavity 120. In such embodiments, the communication connector 150 may have a single row of mating interfaces or a single mating interface.

In an exemplary embodiment, the communication connector 150 includes a housing 157 holding the contacts 152. The housing 157 extends to the front 156. The housing 157 may be mounted to the circuit board. The housing 157 may be loaded into the receptacle housing 108, such as into the bottom of the receptacle housing 108. In an exemplary embodiment, the communication connector 150 may be located at the back end of the receptacle housing 108, such as at the back end of the module cavities 120, 122. In alternative embodiments, the communication connector 150 may be located behind the receptacle housing 108 rather than inside the receptacle housing 108.

In an exemplary embodiment, the liquid cooling assembly 160 is provided for cooling the pluggable module 106 with liquid coolant circulated through the liquid cooling assembly 160. The liquid cooling assembly 160 has a separable interface for interfacing with the pluggable module 106. The liquid cooling assembly 160 allows for direct cooling of the pluggable module 106 with the liquid coolant. In an exemplary embodiment, the liquid cooling assembly 160 includes one or more liquid cooling channels 162 and one or more fittings 164 for interfacing with the pluggable module 106. For example, in an exemplary embodiment, the liquid cooling assembly 160 includes a supply channel 170 and a return channel 172. The liquid cooling assembly 160 includes a supply fitting 174 and a return fitting 176.

The liquid cooling channels 162 may be defined by pipes, such as flexible pipes, rigid pipes, manifolds, and the like. The liquid cooling channels 162 extend from the exterior of the receptacle housing 108 to the interior of the receptacle housing 108, such as into the module cavity 120 or 122. The liquid cooling channels 162 may extend through one or more of the housing walls 114. For example, in the illustrated embodiment, the liquid cooling channels 162 extend through the back wall 144. The liquid cooling channels 162 may be coupled to one or more of the housing walls 114. The liquid cooling channels 162 may be coupled to the communication connector 150. For example, the liquid cooling channels 162 may be coupled to the housing 157. In various embodiments, as in the illustrated embodiment, the liquid cooling channels 162 may extend through the housing 157. Alternatively, the liquid cooling channels 162 may be routed along the outside of the housing 157 between the exterior of the housing 157 and the interior of the housing walls 114 from the back wall 144 to the front 156 of the housing 157. For example, the liquid cooling channels 162 may extend along the sides of the housing 157 and/or extend over the top of the housing 157 and/or below the housing 157.

The fittings 164 are coupled to the liquid cooling channels 162 and are in flow communication with the liquid cooling channels 162. The fittings 164 have separable mating interfaces for mating with the pluggable modules 106. The fittings 164 configured to be sealed to the pluggable module 106. Optionally, the fittings 164 may be locked when mated with the pluggable modules 106. For example, the fittings 164 may be fluid couplings. The fittings 164 may be quick connect fluid couplings. The fittings 164 may be non-spill fluid couplings. Optionally, the fittings 164 may have shut off valves to shut off fluid flow when disconnected from the pluggable module 106. In various embodiments, the fittings 164 may be male fittings extending outward for receipt in female fittings of the pluggable module 106. In other various embodiments, the fittings 164 may be female fittings defining a socket that receives a male fitting of the pluggable module 106. The fittings 164 may be coupled to one or more of the housing walls 114, such as the top wall 140, the sidewalls 142, 143, the back wall 144, the separator panels 136 or the interior panels 134. In the illustrated embodiment, the fittings 164 are coupled to the communication connector 150. For example, the fittings 164 are coupled to the front 156 of the housing 157 and face the pluggable module 106 for mating with the pluggable module 106 as the pluggable module 106 is loaded into the module cavity 120 or 122. Optionally, the fittings 164 may be coupled to the housing walls 114 or the communication connector 150 by a flexible connection to allow the fittings 164 to float relative to the pluggable module 106 to align with the liquid cooling assembly 230 of the pluggable module 106.

In an exemplary embodiment, the receptacle assembly 104 includes one or more of the liquid cooling assemblies 160. For example, each of the upper module cavities 122 includes one of the liquid cooling assemblies 160. Alternatively, a single liquid cooling assembly 160 may be provided extending into each of the upper module cavities 122. Additionally or alternatively, the lower module cavities 122 may include liquid cooling assemblies 160. The liquid cooling assemblies 160 are configured to be in flow communication with the pluggable modules 106 when the pluggable modules 106 are plugged into the module cavities 120, 122. In an exemplary embodiment, the liquid cooling assemblies 160 extend through at least one of the housing walls 114, such as through a back housing wall, to the exterior of the receptacle housing 108, such as to a manifold, heat exchanger or other device. Optionally, each module cavity 120 or 122 may receive multiple liquid cooling assemblies 160.

Figure 5:
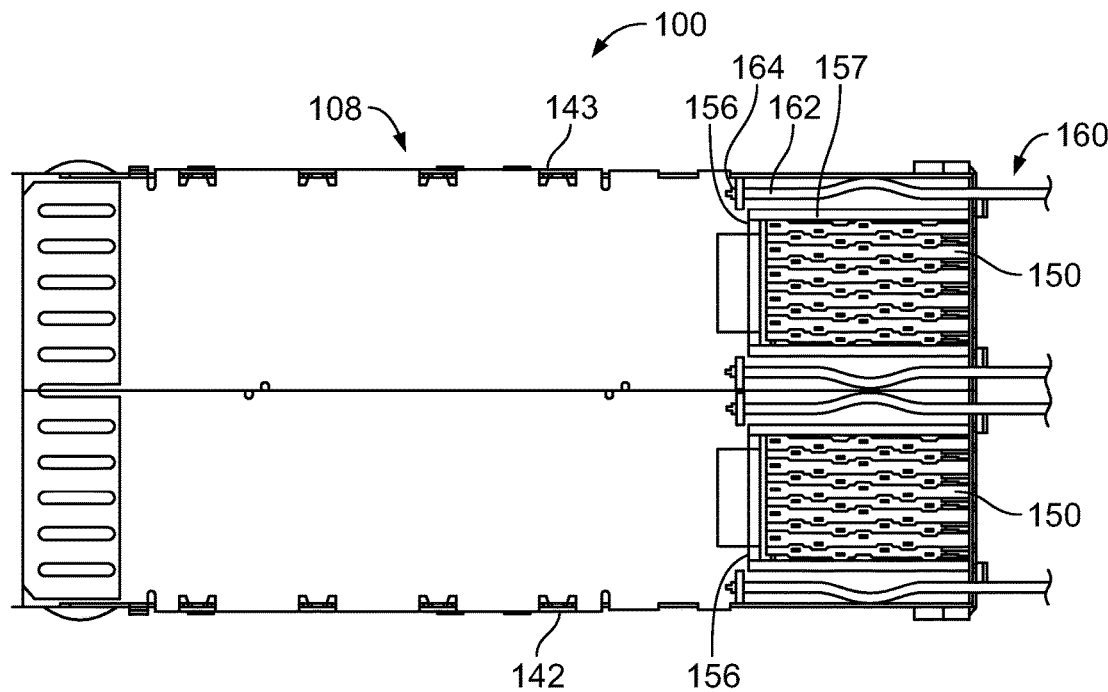
FIG. 5 is a top, cross-sectional view of a portion of the communication system in accordance with an exemplary embodiment.

FIG. 5 is a top, cross-sectional view of a portion of the communication system 100 in accordance with an exemplary embodiment. FIG. 5 illustrates the liquid cooling assembly 160 with the liquid cooling channels 162 routed differently than shown in FIG. 4. The liquid cooling channels 162 are routed along the side walls 142, 143 and the interior panel 134 rather than being routed through the housing 157 of the communication connector 150. The fittings 164 are coupled to the sidewalls 142, 143 and the interior panel 134 forward of the front 156 of the communication connector 150 rather than being coupled to the communication connector 150. The fittings 164 are positioned for coupling with the pluggable module 106 (FIG. 2) when loaded in the receptacle housing 108.

Figure 6:
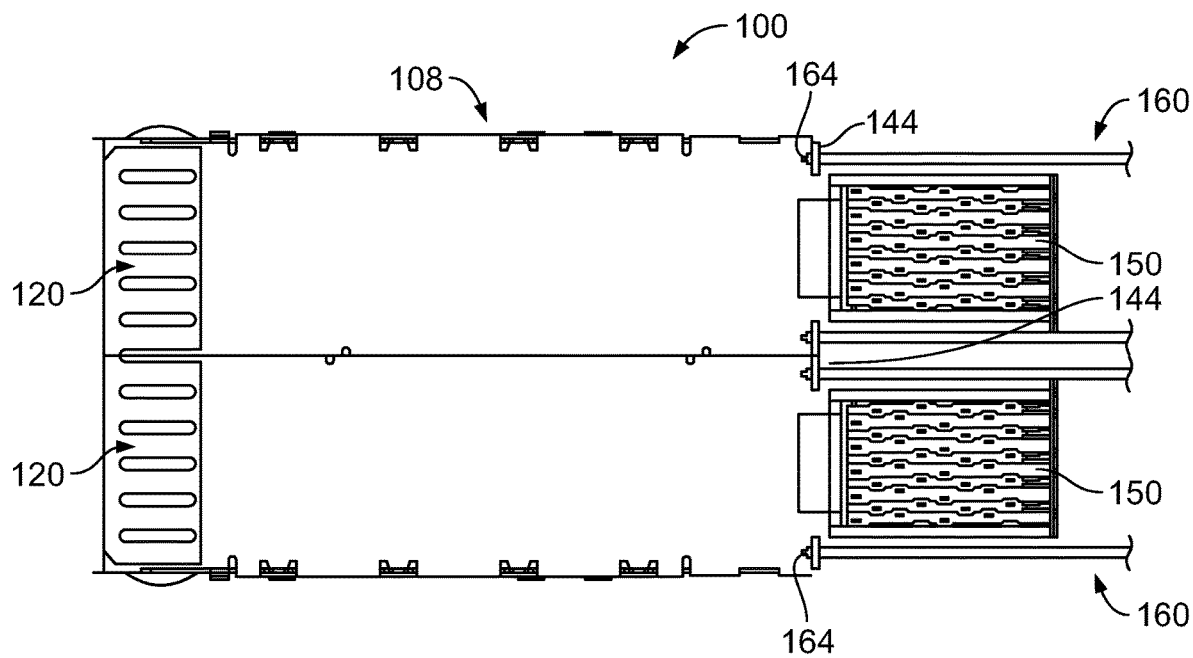
FIG. 6 is a top, cross-sectional view of a portion of the communication system in accordance with an exemplary embodiment.

FIG. 6 is a top, cross-sectional view of a portion of the communication system 100 in accordance with an exemplary embodiment. FIG. 6 illustrates the communication connector 140 rearward of the back wall 144 of the receptacle housing 108. FIG. 6 illustrates the liquid cooling assembly 160 coupled to the receptacle housing 108. The fittings 164 are coupled to the back wall 144 and configured to be coupled to the pluggable module 106 when the pluggable module 106 is loaded into the module cavity 120.

Figure 7:
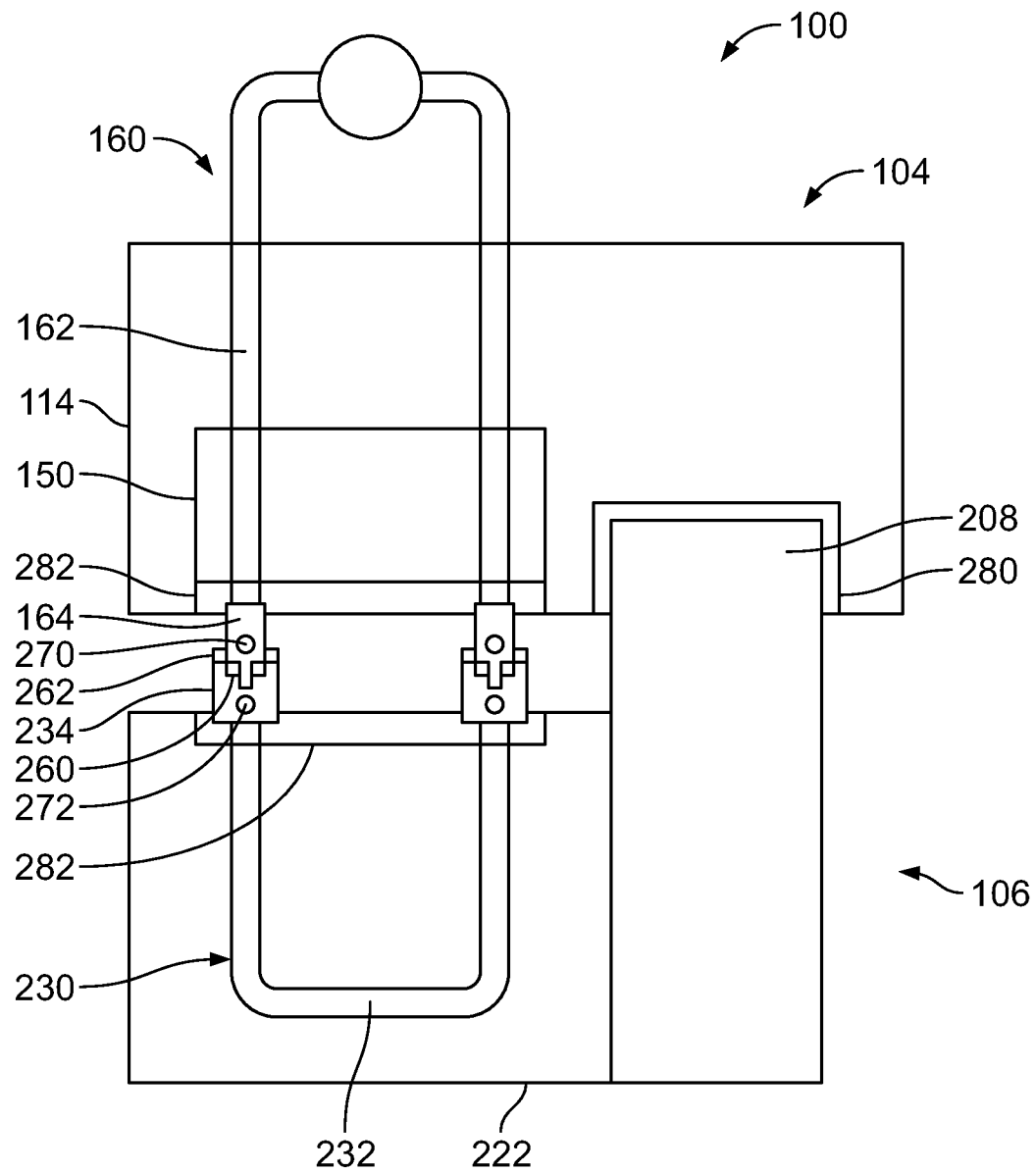
FIG. 7 is a schematic view of the communication system in accordance with an exemplary embodiment.

FIG. 7 is a schematic view of the communication system 100 in accordance with an exemplary embodiment. FIG. 7 illustrates the liquid cooling assembly 160 in the receptacle assembly 104 and the liquid cooling assembly 230 in the pluggable module 106. The liquid cooling channel 162 is in flow communication with the liquid cooling channel 232 via of the fittings 164 and the module fittings 234.

In an exemplary embodiment, the fitting 164 interfaces with the module fitting 234 at a sealed interface defined by a seal 260 between the fitting 164 and the module fitting 234. In an exemplary embodiment, the fitting 164 interfaces with the module fitting 234 at a locked interface defined by a locking mechanism 262 between the fitting 164 and the module fitting 234. The locking mechanism 262 may be held by the fitting 164 and/or the module fitting 234. The locking mechanism 262 is releasable to release the pluggable module 106 from the receptacle assembly 104. In an exemplary embodiment, the fitting 164 includes a shut off valve 270 and the module fitting 234 includes a shut off valve 272 to shut off to flow when the fitting 164 and the module fitting 234 are unmated.

In an exemplary embodiment, the communication system 100 includes an electrical guide element 280 to guide mating of the electrical interface between the pluggable module 106 and the communication connector 150 of the receptacle assembly 104. In various embodiments, the electrical guide element 280 may be defined, at least in part, by the housing walls 114. The electrical guide element 280 may be defined, at least in part, by the edge of the module circuit board 208 and the shroud of the communication connector 150 defining the card slot that receives the module circuit board 208.

In an exemplary embodiment, the communication system 100 includes a liquid guide element 282 to guide mating of the liquid cooling assembly 160 with the liquid cooling assembly 230. In various embodiments, the liquid interface is guided independently of the electrical interface. For example, the module circuit board 208 is guided independently of mating of the fittings 164 with the module fittings 234. In various embodiments, the independent guidance may be achieved by allowing the fittings 164 to float relative to the communication connector 150 and/or the housing walls 114. For example, the fittings 164 may be mounted on brackets that allowed a limited amount of floating movement within the module cavity to align to the module fittings 234. In other embodiments, the independent guidance may be achieved by allowing the module fittings 234 to float relative to the module circuit board 208. For example, the upper shell 222, which holds the module fittings 234, may be allowed to float relative to the module circuit board 208.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
   a receptacle assembly configured to receive a pluggable transceiver module having a liquid cooling channel, the receptacle assembly comprising:
   a receptacle housing comprising a top wall and side walls enclosing a module cavity configured to receive the pluggable transceiver module, the top wall and the side walls providing electrical shielding for the pluggable transceiver module, the receptacle housing having a port at a front end of the module cavity configured to receive the pluggable transceiver module;
   a communication connector positioned relative to the module cavity to interface with the pluggable transceiver module, the communication connector including a card slot configured to receive a module circuit board of the pluggable transceiver module to create an electrical connection with the pluggable transceiver module, the communication connector having a connector interface at a front of the communication connector facing the module cavity; and
   a liquid cooling assembly having a liquid cooling channel received in the receptacle housing, the liquid cooling channel having a cooling channel interface for interfacing with the pluggable transceiver module, the cooling channel interface being provided at the front substantially coplanar with the connector interface for interfacing with the pluggable transceiver module, the liquid cooling channel providing liquid cooling supply for the pluggable transceiver module, the liquid cooling assembly having a fitting in flow communication with the liquid cooling channel and configured to be in fluid communication with the liquid cooling channel of the pluggable transceiver module, wherein the fitting is movable relative to the receptacle housing for floating alignment with the liquid cooling channel of the pluggable transceiver module.

2. The communication system of claim 1, wherein the liquid cooling assembly includes a pipe defining at least a portion of the liquid cooling channel.

3. The communication system of claim 1, wherein the liquid cooling assembly includes a supply pipe and a return pipe defining at least a portion of the liquid cooling channel, the fitting being a supply fitting coupled to the supply pipe, the liquid cooling assembly including a return fitting coupled to the return pipe.

4. The communication system of claim 1, wherein the liquid cooling channel passes through the communication connector to the front of the communication connector and is coupled to the communication connector.

5. The communication system of claim 1, wherein the walls of the receptacle housing include a back wall, the liquid cooling channel being coupled to the back wall.

6. The communication system of claim 1, wherein the liquid cooling channel includes a pipe routed through a corresponding wall of the receptacle housing from an exterior of the receptacle housing into the module cavity.

7. The communication system of claim 1, wherein the liquid cooling channel includes a pipe routed through the communication connector.

8. The communication system of claim 1, wherein the fitting being coupled to the front of the communication connector.

9. The communication system of claim 1, wherein the module cavity is an upper module cavity, the receptacle housing further comprising a lower module cavity below the upper module cavity, the liquid cooling assembly further comprising a second fitting in flow communication with the liquid cooling channel and configured to be in flow communication with a liquid cooling channel of a pluggable transceiver module received in the lower module cavity.

10. The communication system of claim 1, wherein the module cavity is an upper module cavity, the receptacle housing further comprising a lower module cavity below the upper module cavity, the liquid cooling assembly further comprising a second liquid cooling channel and a second fitting in flow communication with the second liquid cooling channel, the second fitting configured to be in flow communication with a liquid cooling channel of a pluggable transceiver module received in the lower module cavity.

11. The communication system of claim 1, wherein the fitting is coupled to a corresponding wall of the receptacle housing.

12. The communication system of claim 1, wherein the fitting includes a shut off valve.

13. The communication system of claim 1, wherein the entire fitting moves relative to the receptacle housing.

14. A communication system comprising:
   a receptacle assembly having a receptacle housing comprising a top wall and side walls enclosing a module cavity, the top wall and the side walls providing electrical shielding for the module cavity, the receptacle housing having a port at a front end of the module cavity, the receptacle assembly having a communication connector positioned at a back end of the module cavity, and the communication connector having a card slot at a connector interface at a front facing the module cavity, the receptacle assembly having a liquid cooling assembly at the connector interface having a liquid cooling channel coupled to the receptacle housing and the communication connector, the liquid cooling assembly having a fitting at the front of the communication connector in flow communication with the liquid cooling channel, the fitting being substantially coplanar with the connector interface at the front of the communication connector; and
   a pluggable transceiver module receivable in the module cavity, the pluggable transceiver module having a pluggable body extending between a mating end and a rear end, the pluggable transceiver module including a cable extending from the rear end, the pluggable transceiver module having a module circuit board held by the pluggable body, the cable being coupled to the module circuit board, the module circuit board having a card edge plugged into the card slot of the communication connector to be electrically connected to the communication connector, the pluggable transceiver module having a liquid cooling assembly coupled to the pluggable body including a liquid cooling channel in thermal communication with the pluggable body, the liquid cooling assembly including a module fitting at the mating end of the pluggable body;
   wherein at least one of the fitting and the module fitting are movable for floating alignment between the fitting and the module fitting, wherein the module fitting is mated with the fitting of the receptacle assembly to couple the liquid cooling channel of the pluggable transceiver module in flow communication with the liquid cooling channel of the receptacle assembly.

15. The communication system of claim 14, wherein the liquid cooling channel of the pluggable transceiver module has a serpentine path through the pluggable body.

16. The communication system of claim 14, wherein the pluggable body includes an upper shell and a lower shell holding the module circuit board, the liquid cooling channel of the pluggable transceiver module being defined in the upper shell.

17. The communication system of claim 16, wherein the liquid cooling channel of the pluggable transceiver module is confined in the pluggable body between the upper shell and the lower shell with the module fitting at the mating end.

18. The communication system of claim 14, wherein the module fitting is an inlet module fitting, the liquid cooling assembly of the pluggable transceiver module further comprising an outlet module fitting in flow communication with the liquid cooling channel of the pluggable transceiver module.

19. The communication system of claim 14, wherein at least one of the module fitting and the fitting include a seal.

20. The communication system of claim 14, wherein the pluggable transceiver module includes an actuator operably coupled to the module fitting to unlock the module fitting from the fitting to uncouple the module fitting from the fitting.

21. A pluggable transceiver module for mating with a receptacle assembly having a receptacle housing including a communication connector positioned at a back end of a module cavity and having a liquid cooling assembly with a liquid cooling channel and a fitting in flow communication with the liquid cooling channel, the pluggable transceiver module comprising:
   a pluggable body extending between a mating end and a rear end opposite the mating end with a cable extending from the rear end, the mating end configured to be received in the receptacle housing for mating with the communication connector at a mating interface, the pluggable body having an upper shell including an upper wall and a lower shell including a lower wall, the pluggable body including a body cavity;
   a module circuit board received in the body cavity and held by at least one of the upper shell and the lower shell of the pluggable body, the cable being electrically connected to the module circuit board, the module circuit board including an upper surface and a lower surface, the module circuit board configured to be electrically connected to the communication connector, the module circuit board having an electronic component electrically connected to the module circuit board generating heat, the module circuit board including a mating edge at the mating end of the pluggable body configured to be received in a card slot of the communication connector for interfacing with the communication connector at the mating interface; and
   a liquid cooling assembly coupled to the pluggable body, the liquid cooling assembly including a liquid cooling channel in thermal communication with the pluggable body, the liquid cooling assembly including a module fitting at the mating end configured to be mated with the fitting of the receptacle assembly at the mating interface to couple the liquid cooling channel of the pluggable transceiver module in flow communication with the liquid cooling channel of the receptacle assembly, wherein the module fitting is movable relative to the pluggable body for floating alignment with the fitting of the receptacle assembly.

22. The pluggable transceiver module of claim 21, wherein the liquid cooling assembly includes a pipe routed in the pluggable body.

23. The pluggable transceiver module of claim 21, wherein the liquid cooling assembly includes a pipe routed along an exterior of the pluggable body.

24. The pluggable transceiver module of claim 21, wherein the module fitting extends forward of the mating end of the pluggable body and is configured to be plugged into the fitting of the receptacle assembly.

25. The pluggable transceiver module of claim 21, wherein the module fitting includes a receptacle configured to receive the fitting of the receptacle assembly.

* * * * *